United States Patent
Roohparvar

(10) Patent No.: US 7,251,711 B2
(45) Date of Patent: Jul. 31, 2007

(54) APPARATUS AND METHODS HAVING A COMMAND SEQUENCE

(75) Inventor: Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 594 days.

(21) Appl. No.: 10/156,420

(22) Filed: May 28, 2002

(65) Prior Publication Data

US 2003/0225987 A1 Dec. 4, 2003

(51) Int. Cl.
G06F 12/00 (2006.01)
(52) U.S. Cl. ..................... 711/154; 365/233
(58) Field of Classification Search ............. 711/1–6, 711/103–106, 154, 167–173, 101, 155; 365/185.08–9, 365/185.22, 185.24, 226, 230.04
See application file for complete search history.

(56) References Cited

U.S. PATENT DOCUMENTS

| | | | |
|---|---|---|---|
| 4,443,864 A | 4/1984 | McElroy | |
| 5,388,248 A * | 2/1995 | Robinson et al. ............. 365/52 |
| 5,422,855 A * | 6/1995 | Eslick et al. ................ 365/226 |
| 5,450,354 A * | 9/1995 | Sawada et al. ........ 365/185.24 |
| 5,457,694 A * | 10/1995 | Smith ......................... 714/712 |
| 5,519,847 A * | 5/1996 | Fandrich et al. ............ 711/169 |
| 5,568,426 A | 10/1996 | Roohparvar et al. ... 365/185.22 |
| 5,587,961 A | 12/1996 | Wright et al. ............... 365/233 |
| 5,598,376 A | 1/1997 | Merritt et al. ......... 365/230.06 |
| 5,600,605 A | 2/1997 | Schaefer ..................... 365/233 |
| 5,636,173 A | 6/1997 | Schaefer ................. 365/230.03 |
| 5,655,105 A * | 8/1997 | McLaury ..................... 711/169 |
| 5,673,233 A | 9/1997 | Wright et al. ............... 365/233 |
| 5,677,879 A | 10/1997 | Roohparvar et al. ... 365/185.22 |
| 5,737,258 A * | 4/1998 | Choi et al. .................... 365/63 |
| 5,757,703 A | 5/1998 | Merritt et al. ......... 365/189.05 |
| 5,768,287 A | 6/1998 | Norman et al. ............. 371/21.2 |
| 5,877,987 A | 3/1999 | Merritt .................. 365/189.05 |
| 5,880,987 A | 3/1999 | Merritt ......................... 365/51 |
| 5,890,193 A | 3/1999 | Chevallier ................... 711/103 |
| 5,974,499 A | 10/1999 | Norman et al. | |
| 5,986,570 A | 11/1999 | Black et al. ........... 340/825.54 |
| 5,986,944 A | 11/1999 | Merritt .................. 635/189.05 |
| 6,043,107 A | 3/2000 | Merritt ........................ 438/106 |
| 6,044,429 A | 3/2000 | Ryan et al. ................. 710/131 |
| 6,049,489 A | 4/2000 | Merritt .................. 365/189.05 |
| 6,075,973 A | 6/2000 | Greeff et al. .............. 340/10.3 |
| 6,091,319 A | 7/2000 | Black et al. ............... 340/10.2 |

(Continued)

OTHER PUBLICATIONS

Mills et al., Feb. 15-17, 1995, IEEE, pp. 120-121.*

Primary Examiner—Brian E. Peugh
Assistant Examiner—Hashem Farrokh
(74) Attorney, Agent, or Firm—Schwegman, Lundberg, Woessner & Kluth, P.A.

(57) ABSTRACT

Power consumption by a memory device is optimized by maintaining data input buffers in an off state until a command sequence containing a write command is received by the memory. A command sequence is provided to the memory device where the command sequence was constructed by generating a command sequence of n cycles and providing valid data in each cycle in which a write command is generated after a $m^{th}$ cycle of the command sequence, where m is less than n. The data input buffers are returned to an off state upon completion of a program or erase operation defined in the received command sequence.

80 Claims, 4 Drawing Sheets

U.S. PATENT DOCUMENTS

| | | |
|---|---|---|
| 6,169,474 B1 | 1/2001 | Greeff et al. ............... 340/10.1 |
| 6,175,937 B1 | 1/2001 | Norman et al. ............. 714/718 |
| 6,229,987 B1 | 5/2001 | Greeff et al. ............... 340/10.1 |
| 6,253,340 B1 | 6/2001 | Cowles et al. ............. 714/718 |
| 6,265,962 B1 | 7/2001 | Black et al. ................ 340/10.2 |
| 6,272,608 B1 | 8/2001 | Ryan et al. .................. 711/167 |
| 6,278,654 B1 | 8/2001 | Roohparvar ............ 365/238.5 |
| 6,307,772 B1 | 10/2001 | Nagaoka |
| 6,307,779 B1 | 10/2001 | Roohparvar ........... 365/185.11 |
| 6,314,049 B1 | 11/2001 | Roohparvar ................ 365/233 |
| 6,324,211 B1 | 11/2001 | Ovard et al. ................ 375/219 |
| 6,356,974 B2 | 3/2002 | Chevallier .................. 711/103 |
| 6,381,180 B1 | 4/2002 | Merritt et al. ......... 365/189.05 |
| 6,415,340 B1 | 7/2002 | Ryan et al. .................... 710/52 |
| 6,438,068 B1 | 8/2002 | Roohparvar ............ 365/238.5 |
| 6,442,076 B1 | 8/2002 | Roohparvar ........... 365/185.33 |
| 6,459,617 B1 | 10/2002 | Roohparvar ........... 365/185.11 |
| 6,459,726 B1 | 10/2002 | Ovard et al. ................ 375/219 |
| 6,466,507 B2 | 10/2002 | Ryan .................... 365/230.01 |
| 6,496,444 B2 | 12/2002 | Roohparvar ................ 365/233 |
| 6,525,971 B2 | 2/2003 | Merritt et al. ......... 365/189.05 |
| 6,526,533 B1 | 2/2003 | Cowles et al. ............. 714/718 |
| 6,535,422 B2 * | 3/2003 | Goto et al. ............ 365/185.11 |
| 6,549,994 B1 | 4/2003 | Noh |
| 6,556,483 B2 | 4/2003 | Ryan et al. ............. 365/189.04 |
| 6,560,668 B2 | 5/2003 | Ryan et al. ................. 710/316 |
| 6,580,659 B1 | 6/2003 | Roohparvar ................ 365/233 |
| 6,606,269 B2 | 8/2003 | Roohparvar ........... 365/185.33 |
| 6,611,885 B2 | 8/2003 | Ryan et al. .................... 710/39 |
| 6,614,698 B2 | 9/2003 | Ryan et al. ............. 365/189.04 |
| 6,615,307 B1 | 9/2003 | Roohparvar ................ 711/103 |
| 6,625,081 B2 | 9/2003 | Roohparvar et al. |
| 6,654,307 B2 | 11/2003 | Widmer et al. ........ 365/230.03 |
| 6,654,313 B2 | 11/2003 | Roohparvar ................ 365/233 |
| 6,657,899 B2 | 12/2003 | Roohparvar ........... 365/185.33 |
| 6,658,552 B1 | 12/2003 | Klein .......................... 712/34 |
| 6,667,932 B2 | 12/2003 | Roohparvar et al. ... 365/230.03 |
| 6,691,204 B1 | 2/2004 | Roohparvar ................ 711/103 |
| 6,748,482 B1 | 6/2004 | Fackenthal |
| 2001/0008495 A1 | 7/2001 | Tsuda |
| 2002/0131085 A1 * | 9/2002 | Kobayashi ................ 358/1.16 |
| 2002/0184579 A1 * | 12/2002 | Alvarez et al. ............. 714/719 |
| 2003/0023840 A1 | 1/2003 | Zitlaw et al. ................... 713/1 |
| 2006/0265564 A1 | 11/2006 | Roohparvar |

* cited by examiner

APPARATUS AND METHODS HAVING A COMMAND SEQUENCE

FIELD OF THE INVENTION

The invention relates to integrated circuit devices. Specifically, the invention relates to memory devices having a software command sequence for optimized power consumption.

BACKGROUND OF THE INVENTION

Nonvolatile memories are used to store important information, such as the code that runs the machines in which these memories are used. Consequently, most non-volatile memory devices do not allow a simple write command to change the data in the memory device. As a safety precaution, to insure code and data integrity, a sequence of write operations with specific data and addresses are required to initiate the programming or erasing of data in a location of the memory device.

With today's devices becoming faster, using wider data widths (data words having an increased number of bits per word), and requiring the use of lower power devices, circuit design and system design are becoming a more complex task. Adding to the design complexity for a non-volatile memory, such as a synchronous Flash memory, is the need to satisfy the speed, density, and power requirements along with the requirement of completing a sequence of write operations prior to the actual programming or erasing of a non-volatile memory.

For example, a synchronous Flash memory operates at speeds exceeding 100 MHz. Operating at such speeds requires a read or write cycle timing of less than 10 ns. Additionally, the design criteria for this high speed device requires that the Flash memory must accommodate a 32 bit wide data bus. Further, with some forms of Flash memory also required to operate at 1.8 V, associated specifications lead to aggressive current consumption.

With the synchronous Flash memory operating at a high speed, where it may receive a command at any moment, all address and data buffers of the Flash memory are in a powered up state. Additionally, detection circuitry used to receive signals for command execution are also in an on state. Consequently, a significant portion of the circuits within the synchronous Flash memory are continually configured in an on state. As long as the system using the Flash memory is providing power, the Flash memory will be creating a current consumption issue.

For these and other reasons there is a need for the present invention.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description is, therefore, not to be taken in a limiting sense, and the scope of the present invention is defined by the appended claims and their equivalents.

Figure 1:
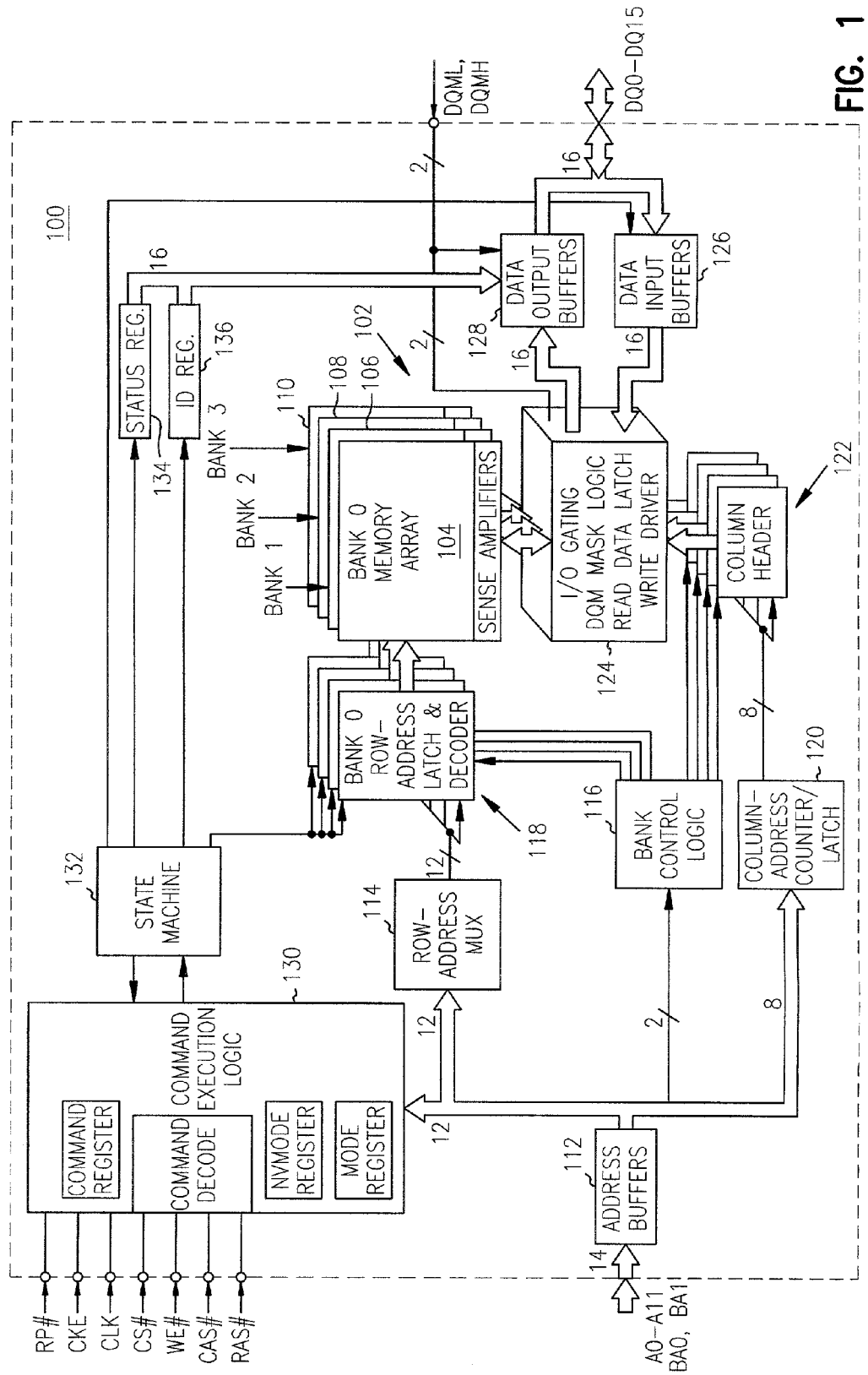
FIG. 1 shows a block diagram of an embodiment for a memory device for implementing a write command sequence, in accordance with the teachings of the present invention.

FIG. 1 shows a block diagram of an embodiment for a memory device 100 for implementing a write command sequence, in accordance with the teachings of the present invention. The memory device 100 is a synchronous flash memory device, in particular, a nonvolatile, electrically sector-erasable (flash), programmable read-only memory. Other memory devices, including other flash memory devices, having different bit/word densities can be used in an embodiment of the teachings of the present invention. The memory device 100 has been provided in FIG. 1 and simplified in its description to focus on the features of the memory device and its operation, which are helpful in understanding an embodiment of the present invention.

The memory device 100 includes a memory array 102 of non-volatile flash memory cells (not shown), arranged in several addressable banks. Advantageously, the memory device 100 is arranged containing four memory banks 104, 106, 108 and 110. Each memory bank contains addressable sectors of memory cells, and is organized into four independently erasable blocks (16 total). As noted above, a memory device in an embodiment of the teachings of the present invention is not limited to a memory device having addressable banks or to memory devices having four memory banks, but may include as many memory banks as necessary for efficient handling of data, dependent on the bit/word densities of the memory device.

The data stored in the memory device 100 can be accessed using externally provided location addresses received by address buffer 112. The addresses are decoded using row address multiplexer circuitry 114. The addresses are also decoded using bank control logic 116, and row address latch and decode circuitry 118. To access an appropriate column of the memory device 100, column address counter and latch circuitry 120 couples the received addresses to column decode circuitry 122. Circuit 124 provides input/output gating, data mask logic, read data latch circuitry and write driver circuitry. Data is input through data input buffers 126 and output through data output buffers 128.

Command and execute logic 130 is provided to control the basic operations of the memory device 100. A state machine 132 is also provided to control specific operations performed on the memory arrays and cells. A status register 134 and an identification register 136 can also be provided to output status data.

Commands for operating the memory device 100 are provided externally to the memory device 100, along with data on DQ0–DQ15, address information on A0–A11, and memory bank identification on BA0–BA1. The size of the data, addresses, and memory bank identification will vary from memory device to memory device based on the bit/word density being used. As can be appreciated by those skilled in the art, commands signals such as clock signal (CLK), clock enable (CKE), chip select (CS#), input/output mask (DQM), reset/power-down (RP#), row address strobe (RAS#), column address strobe (CAS#), and write enable (WE#) are used in various combinations to provide the commands for the memory device 100 to operate on the memory locations identified by the address information from A0–A11 and BA0–BA1.

The address inputs A0–A11 are sampled to select one location in a respective memory bank. Other addressing is provided by the bank address inputs, BA0 and BA1, that define a bank to which a command is being applied. In embodiments without such a bank architecture, the BA01 and BA02 are used as part of the address, increasing the address input. The data input and output from memory locations defined by A0–A11 and BA0–BA02 move in and out of the memory device 100 through DQ0–DQ15, which handles bi-directional data.

Since nonvolatile memories are used to store important information, most non-volatile memory devices do not allow a simple write command to change the data in the memory device. Consequently, as a safety precaution to insure code and data integrity, a specified or predetermined sequence of write operations with specific data and addresses are required to initiate the programming or erasing of data in a location of the memory device. For example, to program or erase a location in memory, a write command sequence directed to the memory device 100 includes a number of cycles, where each cycle has specific or predetermined signal requirements.

During each cycle, the memory device 100 receives a command, an address, data and other control signals. The complete address can be broken into an address within a bank and a bank identification. As previously mentioned, a command is defined by a specific status of the control signals or a subset of the control signals externally provided to the memory device. Depending on the command signal, additional command and control information can be supplied in one cycle by providing a specific code on the data inputs DQ. In some cycles, the predetermined information expected can be an arbitrary data for that particular cycle.

Embodiments of the teachings of the present invention use the nature of the write command sequence to address the current consumption issues of a memory device, in particular, a non-volatile memory device such as a flash memory. Current is consumed when data and address buffers are constantly maintained in an on state, which on state continues as long as the memory device is on. For the memory device 100, received commands are related to operations on data located at a given address, so that essentially all commands require use of the address buffers 112. In particular, a non-volatile memory device processes read operations a significant portion of its operating time. Therefore, the address buffers 112 need to be maintained in the on state, since commands can be applied to the memory device at any time.

However, the data input buffers 126 are essentially used for programming and erasing operations. For non-volatile memories, programming and erasing activities comprise a relatively small amount of the activity of these memories. In one embodiment according to the teachings of the present invention, the data input buffers 126 are maintained in off state until needed, reducing the amount of current consumed by the memory device. Maintaining the data input buffers in off and on states is facilitated by the requirement that a program or erase operation is only performed after the memory device 100 has received a specific sequence of commands with associated addresses and data inputs.

The data input buffers 126 can be placed in an on state during one of the cycles of a write command sequence received by the memory device 100. The data input buffers will remain on during the remainder of the write command sequence performing standard tasks as can be understood by those skilled in the art. At the completion of the operation defined in the write command sequence, the memory device 100 places the data input buffers 126 in an off state, until the memory device 100 receives another write command sequence. In various embodiments of the teachings of the present invention, the memory device 100 can place the data input buffers 126 in an on state during different cycles of the write command sequence dependent upon the write command sequence for which the memory device 100 is configured.

Alternately, the data input buffers 126 can be placed in an on state during one of the cycles of a command sequence containing a write command that is received by the memory device 100. Thus, various command sequences can be implemented to include embodiments of the present invention. The description of the various embodiments that follow are presented in terms of a write command sequence. However, other command sequences that make use of data input buffers and include a write command in one or more of its cycles can be used in the various embodiments, as can be understood by those skilled in the art.

In one embodiment, a software command sequence for operating a memory device is shown in Table 1. As shown, the software command sequences include a read command sequence and a write command sequence. Though not demonstrated in this table, both a set of read command sequences and a set of write command sequences include command tasks other than the two read operations and the two write operations shown in Table 1. During each cycle, specific command, address, data, and control signal RP# are expected, where the command is defined by a set combination of control signals as previously mentioned. The notation X for an input signal means that for the given cycle no particular information is expected from this input signal. It is essentially "Don't Care" information, which the memory device does not use or need in the given cycle.

In one embodiment, the memory device 100 can use the command and address locations to distinguish between a read command sequence and a write command sequence. For instance, on a first cycle of a read command sequence, the inputs to the memory device are an active command with an address 88h. On the other, if the memory device 100 receives a command that is active with an address other than 88h, the memory device 100 prepares for subsequent cycles of a write command sequence. If in the second cycle, information is received on the control signals, address inputs, data inputs, or RP# that is different than expected for the command sequence identified from the first cycle, the memory device 100 will prohibit, i.e., not perform the operation defined in the command sequence, as the memory device has determined the command sequence to be invalid.

is generated after a $m^{th}$ cycle of the write command sequence, where m is less than n. The data input buffers are returned to an off state upon completion of a program or erase operation defined in the received write command sequence.

Memory Devices

Figure 2:
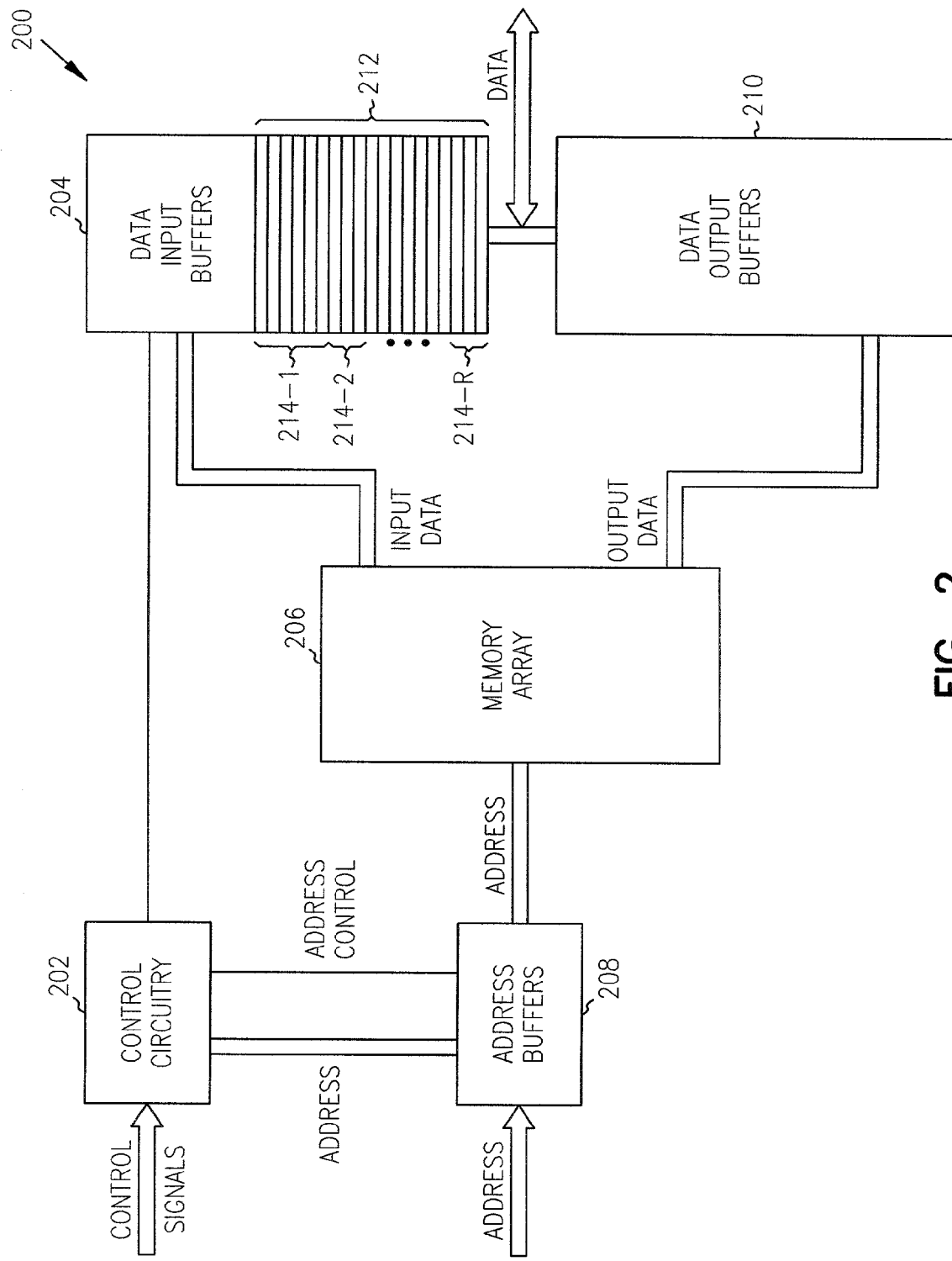
FIG. 2 shows a block diagram of an embodiment of functional aspects of a memory device including control circuitry and data input buffers for using a write command sequence, in accordance with the teachings of the present invention.

FIG. 2 shows a block diagram of an embodiment of functional aspects of a memory device 200 including control circuitry 202, and data input buffers 204 for using a write command sequence, in accordance with the teachings of the present invention. The data input buffers 204 are configured in an off state, and are switchable to an on state in response to the control circuitry 202 detecting an externally generated write command sequence having n cycles. The number of cycles used is dependent upon a particular memory device.

TABLE 1

| OPERATION | FIRST CYCLE | SECOND CYCLE | THIRD CYCLE | FOURTH CYCLE | FIFTH CYCLE | SIXTH CYCLE | SEVENTH CYCLE | EIGHTH CYCLE |
|---|---|---|---|---|---|---|---|---|
| READ DEVICE CONFIGURATION | | | | | | | | |
| Command | Active | Write | Active | Read | | | | |
| Addr = | 88 h | 90 h | CA (row) | CA (col) | | | | |
| Bank Addr = | X | X | Bank | Bank | | | | |
| DQ = | X | X | X | X | | | | |
| RP# = | H | H | H | H | | | | |
| READ STATUS REGISTER | | | | | | | | |
| Command | Active | Write | Active | Read | | | | |
| Addr = | 88 h | 70 h | X | X | | | | |
| Bank Addr = | X | X | X | X | | | | |
| DQ = | X | X | X | X | | | | |
| RP# = | H | H | H | H | | | | |
| ERASE SETUP/CONFIRM | | | | | | | | |
| Command | Active | Write | Active | Write | Active | Write | Active | Write |
| Addr = | X | 55 h | 55 h | 2 Ah | 80 h | 40 h | Row | X |
| Bank Addr = | X | Bank | Bank | Bank | Bank | Bank | Bank | Bank |
| DQ = | X | X | X | 55 h | X | A0 h | X | D0 h |
| RP# = | H | H | H | H | H | H | H | H/VHH |
| PROGRAM SETUP/CONFIRM | | | | | | | | |
| Command | Active | Write | Active | Write | Active | Write | Active | Write |
| Addr = | X | 55 h | 55 h | 2 Ah | 80 h | 40 h | Row | Col |
| Bank Addr = | X | Bank | Bank | Bank | Bank | Bank | Bank | Bank |
| DQ = | X | X | X | 55 h | X | A0 h | X | DIN |
| RP# = | H | H | H | H | H | H | H | H/VHH |

The nature of write command sequences, as exemplified in Table 1, provides for various embodiments of the teachings of the present invention. Embodiments are directed to the generation of a write command sequence to facilitate the command and control of an on state and an off state of data input buffers in a memory device. Other embodiments are directed to the memory devices, memory modules, information handling systems, and other devices that manage the on and off states of data input buffers using an externally generated write command sequence. These two sets of embodiments are examined in the sections that follow.

Power consumption by a memory device is optomized by maintaining data input buffers in an off state until a command sequence using the data input buffers and including a write command is received by the memory device. A software command sequence is provided to the memory device, where the software command sequence is constructed by generating a write command sequence of n cycles and providing valid data in each cycle in which a write command In one embodiment, a memory device 200 responds to a write command sequence of eight cycles, e.g. n=8.

The functional aspects of the memory device 200 are shown in simplified form to help understand the memory device and its operation, in an embodiment according to the teachings of the present operation. The memory device 200 includes control circuitry 202 for controlling read, program, and erase operations of memory locations in a memory array 206, where the memory locations are identified by an address externally input to address buffers 208. Data is input to the memory device 200 on lines that are bi-directional with input data delivered to the data input buffers 204, which provides the input data to the memory array 206. Output data is provided from the memory array 206 to the data lines through data output buffers 210. The control of the flow of data in and out of the memory array 206 is performed by control circuitry 202.

The control circuitry 202 is coupled to address buffers 208 to control access to a memory location of memory array 206 identified by an address externally received. The control circuitry 202 receives the address from the address buffers 208 along with externally generated control signals that define the command, or operation, that is to be performed on the memory location defined by the received address. The control circuitry 202 provides a signal(s) for address control for opening the memory location in the memory array 206 from the address received from the address buffers 208.

The control circuitry 202 is also coupled to the data input buffers 204 for controlling input data externally provided. The control circuitry 202 switches the data input buffers 204 from an off state to an on state during a write command sequence based on the command that the control circuitry 202 decodes from the control signals externally supplied to the control circuitry 202 and from the address input to the address buffers 208. The control circuitry 202 monitors each cycle of a detected write command sequence to determine that each cycle contains a predetermined signal set having a command, address, and specific data requirements. Upon determining that the write command sequence has valid inputs in each cycle of the write command sequence, the control circuitry 202 allows the execution of the program or erase command defined in the write command sequence. Further, the control circuitry 202 is configured to place the data input buffers 204 in an off state upon completing the execution of the operation defined by the write command sequence. To provide for optimized power consumption, the off state is the normal configuration for the data input buffers 204.

The control circuitry 202 is configured to monitor and decode the information in each cycle of the write command sequence. In one embodiment, the control circuitry 202 places the data input buffers 204 in an on state after detecting the first cycle of a write command sequence. The first cycle can be an active command with an address other than an address specified for a read command sequence. Alternately, the control circuitry 202 is configured to place the data input buffers 204 on after detecting the first cycle of a write command sequence containing a write command. In one embodiment, the control circuitry 202 is additionally configured to examine the address associated with a write command to monitor for a predetermined address to initiate its control of the data input buffers 204. In another embodiment, the control circuitry 202 is configured to turn on the data input buffers 204 in any cycle of the write command sequence after detecting either the first cycle or the first cycle containing a write command.

In some instances, it may be necessary to have one or more data input buffers configured continually in an on state, similar to the address buffers remaining continually in an on state. The memory device 200 can be configured with a first plurality of data input buffers configured in an off state, such that the first plurality of data input buffers are placed in an on state in response to the control circuitry 202 detecting a first m cycles of an externally generated write command sequence of n cycles, where m is less than n. Further, the memory device 200 includes a second plurality of data input buffers continuously configured in an on state. Alternately, the memory device 200 can include a second plurality of data input buffers configured in an off state that are placed in an on state on a $k^{th}$ cycle, k<n, of the write command sequence in response to the control circuitry 202 detecting a first cycle of the externally generated write command sequence. For instance, a first plurality of data input buffers is turned on after the control circuitry 202 detects a first cycle (m=1), and a second plurality of data input buffers is turned on in the fourth cycle (k=4). Alternately, the second plurality of data input can be placed in an on state on a $k^{th}$ cycle of the write command sequence in response to the control circuitry 202 detecting a first cycle containing a write command.

In one embodiment, the data input buffers of memory device 200 include a total of T data input buffers 212 configured in an off state. The T data input buffers 212 are grouped into R sets 214-1–214-R of data input buffers, where R is less than or equal to T. Each set of data input buffers 214-1–214-R are switchable from an off state to an on state by the control circuitry 202 based on criteria independent for each set. In response to receiving a write command sequence, the control circuitry 202 places a $j^{th}$ set of the R sets 214-1–214-R of data input buffers into an on state beginning for a $m_j^{th}$ cycle of an externally generated write command sequence of n cycles. The $m_j^{th}$ cycle is different for each $j^{th}$ set. Alternately, the $m_j^{th}$ cycle is the same for each $j^{th}$ set. Furthermore, one or more $j^{th}$ sets can be configured as continually in an on state, such that when an operation defined by the write command sequence completes the one or more $j^{th}$ sets remain in the on state, while the control circuitry 202 places the remaining data input buffers of the total data input buffers into an off state.

In one embodiment, a memory device 200 comprises 32 data input buffers. The 32 data input buffers are be divided into 3 sets with 16 data input buffers in one set, and 8 data input buffers in each of the other two sets. The control circuitry 202 places the 16 data input buffers in an on state for the third cycle based on detecting a write command in the second cycle, places one set of 8 data input buffers in an on state for the fourth cycle based on detecting a proper command and address in the third cycle, and places the second set of 8 data input buffers in an on state for the fifth cycle based on detecting a proper command and address in the fourth cycle, where the write command sequence has eight cycles.

The control circuitry 202 has a limited amount of time after detecting the first cycle containing a write command to turn on the data input buffers 204 for the next cycle of the write command sequence. Typically, the control circuitry 202 would have about 10 ns to place the data input buffers 204 into an on state for use in the remaining cycles of the write command sequence, where the data input buffers are needed to receive data from the data lines. Once the write sequence properly completes, the programming or erasure is performed and the data input buffers 204 are placed back in an off state until a first or second cycle of a write sequence with a proper address is again detected.

Typically, write command sequences have three to six cycles, which would require the data input buffers to be on only about 20 ns to about 50 ns during the write operations. In other embodiments, the write command sequence can have any number of cycles, ranging typically from two to eight or ten. Longer sequences with more cycles are possible. However, the larger the number of cycles needed to complete the write command sequence, the longer the time period needed to perform the program or erase operation.

It can be appreciated by those skilled in the art that the number of data input buffers and the number of data lines input to the memory device depend on the data word being used. Various embodiments of the teaching of the present invention include 8, 16, 32, 64, 132, etc., data input buffers depending on the design, application, and the fabricating technology for producing an integrated circuit comprising such a memory device.

By maintaining the data input buffers in an off state until a write command sequence is detected, current consumption can be optimized. However, in an embodiment according to the teachings of the present invention, to balance a requirement to have some data input buffers continually on with the need to optimize current consumption, the data input buffers can be organized into groups of data input buffers, where each group is placed in an on state for different portions of a write command sequence.

It can be appreciated by those skilled in the art that FIG. 2 and the description above provides a functional overview and that actual circuitry may comprise several varied circuits expressed as one functional unit, and that several functional units may be combined into one circuit. For instance, in one embodiment, the control circuitry 202 is realized using the command and execute logic 130, state machine 132, bank control logic 116, row address latch and decode circuitry 118, and latch circuitry 120 of memory device 100 in FIG. 1. Further, the control signals to control circuitry 202 include the input signals RP#, CKE, CLK, CS#, WE#, CAS#, and RAS# of FIG. 1. Additionally, the address provided to memory device includes A0–A11 and BA0–BA1 of memory device 100. Other embodiments can be realized implementing the functional relations of memory device 200.

Other devices are used in conjunction with the memory device 200 to provide the memory device 200 with an externally generated write command sequence. In one embodiment, a processor provides a write command sequence to the memory device 200. In another embodiment, a memory module provides a write command sequence to the memory device 200 based on a write request received by the memory module from a processor or other memory controller.

Figure 3:
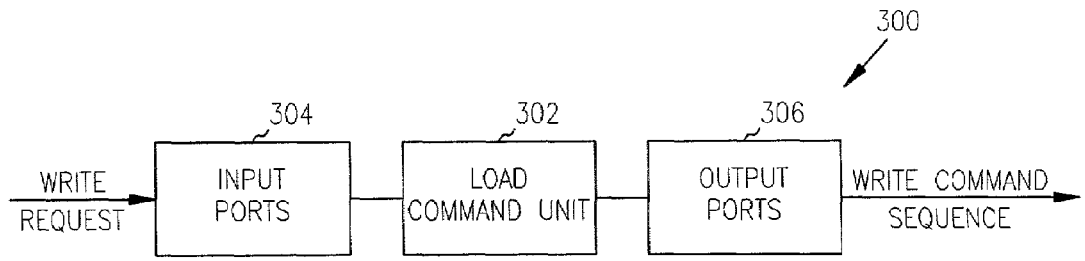
FIG. 3 shows a block diagram of an embodiment for a memory module including a load command unit, input ports, and output ports for providing a write command sequence, in accordance with the teachings of the present invention.

FIG. 3 shows a block diagram of an embodiment for a memory module 300 including a load command unit 302, input ports 304, and output ports 306 for providing a write command sequence, in accordance with the teachings of the present invention. The load command unit 302 converts a write request received on the input ports 304 into a write command sequence. The write command sequence is provided from the memory module 300 to a memory device through the output ports 306 coupled to the load command unit 302. The write request is typically provided from a processor or other memory controller that is not programmed to directly provide a write command sequence having a specific structure as to the number of cycles in the write command sequence, or the required command, address, and data for each cycle.

The load command unit 302 is configured to generate a write command sequence of n cycles, where a write command with associated valid data is generated during a $m^{th}$ cycle, m<n. For each cycle containing a write command from the $m^{th}$ cycle through the $n^{th}$ cycle, the load command unit 302 generates valid data and address information. The last cycle contains the data or code provided in the write request to the memory module 300 received on the input ports 304. This last cycle also contains the memory address to which the data or code is to be applied in the memory device for which the write request is intended. In one embodiment, the load command unit 302 is further configured to generate arbitrary data in each cycle containing a write command that is generated before generating the $m^{th}$ cycle.

The load command unit 302 is configured to generate a write command with valid data beginning with a particular cycle depending on the memory device to which the write command sequence is directed. In some embodiments, valid data is provided after the first cycle of the write command sequence. Alternately, valid data is generated by the load command unit 302 on the first cycle containing a write command and in subsequent cycles having a write command. In another embodiment, the valid data is generated by the load command unit 302 on the second cycle containing a write command.

It can be appreciated by those skilled in the art that the memory module can be implemented as an integrated circuit in the form of a single integrated circuit or as a chip-set. Further, the memory module is formed using standard integrated circuit processing techniques as is known by those skilled in the art.

Figure 4A:
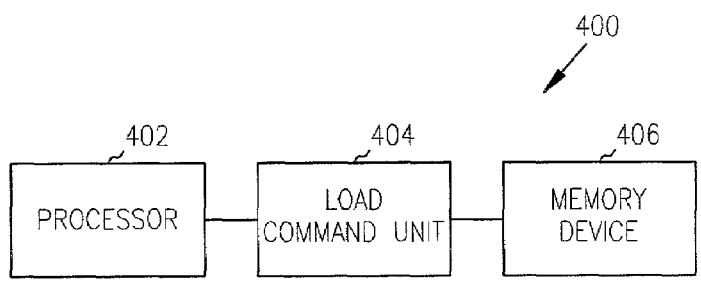
FIG. 4A shows a block diagram of an embodiment of an information handling system including a processor, a load command unit, and a memory device utilizing a write command sequence, in accordance with the teachings of the present invention.

FIG. 4A shows a block diagram of an embodiment of an information handling system 400 including a processor 402, a load command unit 404, and a memory device 406 utilizing a write command sequence, in accordance with the teachings of the present invention. Information handling systems operating at high speeds are constructed using the embodiments discussed herein. Such information handling systems include computers and other systems having processors using high speed memory. In one embodiment, the load command unit 404 is coupled to the processor 403 for receiving a write request. The load command unit 404 is configured to generate a write command sequence of n cycles for the memory device 406 to which it is coupled. The load command unit 404 generates the write command sequence with valid data provided in each cycle containing a write command after a $m^{th}$ cycle, m<n. In one embodiment, the load command unit 404 generates valid data provided in each cycle containing a write command after generating the first cycle of a write command sequence. In another embodiment, valid data is provided in cycles containing a write command after a first cycle containing a write command and arbitrary data is generated.

The memory device 406 includes data input buffers configured in an off state. The memory device 406 is configured to place the data input buffers in an on state upon receiving or detecting the first cycle of an n cycle write command sequence from the load command unit 404. Alternately, memory device 406 places data input buffers in the on state when the memory device 406 determines that a first cycle containing a write command has been received. Upon receiving a complete n cycle write command sequence with proper commands, proper addresses, and valid data, the memory device 406 executes the operation defined by the received and decoded command. Upon completion of the operation, the memory device 406 places the data input buffers in an off state. In one embodiment, memory device 406 comprises the embodiments of the memory device 200 of FIG. 2.

Figure 4B:
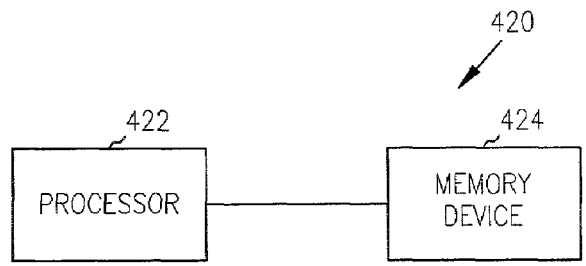
FIG. 4B shows a block diagram of another embodiment of an information handling system including a processor and a memory device utilizing a write command sequence without a separate load command unit, in accordance with the teachings of the present invention.

FIG. 4B shows a block diagram of another embodiment of an information handling system 420 including a processor 422 and a memory device 424 utilizing a write command sequence without a separate load command unit, in accordance with the teachings of the present invention. The processor 422 is coupled to the memory device 424 and generates control and command signals to the memory device 424 for reading and writing operations on data locations within the memory device 424 in support of the applications for which the processor is directed. The memory device 424 comprises an embodiment of memory device 200 of FIG. 2. The memory device 424 includes a control circuitry 202 for receiving control signals from the processor 422 and data input buffers 204, which are normally configured in an off state but are switchable to an on state. The data input buffers 204 are switched to the on state in response to the control circuitry 202 detecting an externally generated write command sequence of n cycles. Further, the control circuitry 202 is also configured to place the data input buffers 204 into an off state upon completing an execution of an operation defined by a write command sequence received from the processor 422.

In one embodiment, the information handling system 422 includes a plurality of memory devices where the memory devices are embodiments of the memory device 200 of FIG. 2. Advantageously, the information handling system 420 includes the processor 422 configured to generate a write command sequence without the use of a load command unit 404 of FIG. 4A. Processor 422 is configured to generate the write command sequence and couple this command sequence to the memory device 424. Such write command sequences include a n cycle sequence with valid data provided on the first cycle containing a write command after the first cycle of the n cycle sequence. Alternately, the processor 422 generates a n cycle sequence with valid data provided on the second cycle containing a write command, where the processor generated arbitrary data or "Don't Care" data on the cycle with the first write command in the n cycle sequence. It can be appreciated by those skilled in the art that the information handling system 422 can be constructed using any embodiment discussed in connection with the memory device 200 of FIG. 2 as the memory device 424.

Software Command Sequence

Table 1 provides an embodiment of software command sequences that can be used to optimize the power consumption of memory devices such as non-volatile memories, in particular, Flash memories. Embodiments are directed to the generation of a write command sequence to facilitate the command and control of an on state and an off state of data input buffers in such memory devices.

Figure 5:
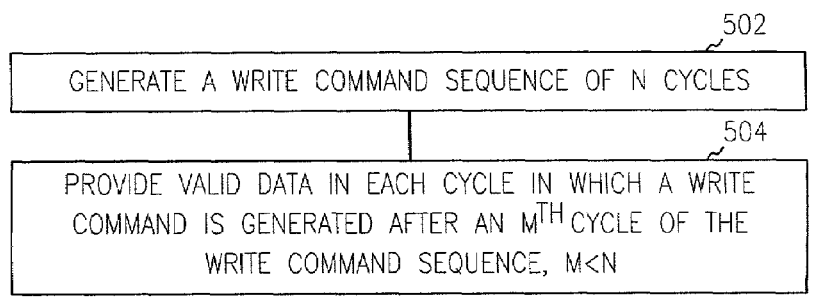
FIG. 5 shows a flow diagram of a method for writing to a memory device providing a write command sequence in an embodiment according to the teachings of the present invention.

FIG. 5 shows a flow diagram of a method for writing to a memory device 200 of FIG. 2 providing a write command sequence in an embodiment according to the teachings of the present invention. In block 502, the method includes generating a write command sequence of n cycles. In block 504, valid data is provided in each cycle in which a write command is generated after the $m^{th}$ cycle, where m is less than n. Further, for those cycles containing a write command prior to the $m^{th}$ cycle, arbitrary data or "Don't Care" data is provided. In one embodiment, a write command sequence is generated with valid data in each cycle containing a write command after the first cycle. Alternately, the write command sequence is generated with valid data provided in the cycles containing a write command after generating a cycle with a first write command having arbitrary data generated in the same cycle.

The write command sequence is generated with predetermined commands, addresses, and data in each cycle subsequent to a first cycle having valid data associated with a write command. The $n^{th}$ cycle is generated with data or codes to be applied to a memory location specified by the address in the last one or two cycles of the write command sequence. For example, in the program setup/confirm of Table 1, the second cycle contains a write command without valid data. Subsequently, the fourth, sixth, and eighth cycles in an eight cycle write command sequence contain a write command and valid data. On the seventh cycle, a row address associated with data to be programmed is generated. Then, on the eighth and final cycle, a write command is generated with a column address, associated with the row address previously provided, along with the data to be programmed. In this embodiment, a bank address is provided on the second cycle and in each subsequent cycle. If the write command sequence is generated without maintaining the same bank after the first cycle, the write command sequence will not be accepted and the operation defined by the command is not executed. Other embodiments can be used to provide this security feature in software command sequences to memory devices without a bank address architecture.

The erasure setup/confirm operation of Table 1 has a similar write command sequence, except that a different address is provided in the seventh cycle, which along with a code in the data signal of the eighth cycle indicates that the write command sequence is for an erase operation of the memory location provided in the seventh and eighth cycles.

For a write command sequence, valid data is data that is required or expected on a particular cycle. For instance, on the last cycle the valid data is the data that is being programmed into a specific memory address. In another instance, valid data on the last cycle is a code for erasure of a specific address or addresses. There may be a specific requirement for the form and nature of the valid data during each cycle of the command write sequence.

In one embodiment, a data requirement is not needed for the first cycle, so that valid data is provided for each cycle after the first cycle. In another embodiment, a particular form of valid data is not required until the second or three cycle. In other embodiments, valid data is needed during some of the cycles of the write command sequence. During the cycles in which valid data is not required, arbitrary data or "Don't Care" data is provided.

In another embodiment of the teachings of the present invention, a method for writing to a memory device 200 of FIG. 2 using a software command sequence includes generating a write command sequence of n cycles, and providing valid data directed to a first plurality of data input buffers of the memory device 200 for each cycle after the $m^{th}$ cycle, m<n. The write command sequence is further generated such that for a second plurality of data input buffers of the memory device 200, valid is provided on the first cycle of the write command sequence. The write command sequence is generated by a processor or memory controller that is programmed with respect to the requirement for the data input buffers of the memory device for which the write command sequence is being generated, as can be appreciated by those skilled in the art. Alternately, the write command sequence is generated with cycles containing a write command and valid data directed to a second plurality of data input buffers on the $k^{th}$ cycle of the write command sequence, where k is less than m. Generating software command sequences with a write command and valid data first available on different cycles allows the tailoring of program or erase operations directed at the memory devices being employed.

In another embodiment of the present invention, a method for writing to a memory device 200 of FIG. 2 using a software command sequence includes generating a write command sequence of n cycles that is directed to providing valid data associated with a write command to each of the data input buffers of the memory device during different cycles. This write command sequence is directed to a memory device whose data input buffers are grouped into R sets, where each set is to be activated to receive valid data in a specified cycle. Thus, valid data is directed to a $j^{th}$ set of the R sets of data input buffers on a $m_j^{th}$ cycle of the write command sequence, $1 \leq j \leq R$ and $1 \leq m_j \leq n$. For example, a memory device can have 32 data input buffers, organized as 4 sets of data input buffers, d1, d2, d3, and d4, and use an 8 cycle write command sequence. The write command sequence can be generated with valid data directed to d1 on the third cycle, directed to set d2 on the fourth cycle, directed to set d3 on the fifth cycle, and directed to set d4 on the sixth cycle. Consequently, though the data input buffers in set d1 must be placed in the on state by the third cycle, the 32 total data input buffers do not need to be placed in the on state until the just prior to the sixth cycle.

It can be appreciated by those skilled in the art that the generation of the write command sequence can be accomplished by different devices. In one embodiment, a processor generates the write command sequence. In another embodiment, a memory module 300 of FIG. 3 receives a write request, generates a write command sequence of n cycles in response to the write request, and provides valid data in each cycle in which a write command is generated after a $m^{th}$ cycle of the write command sequence, m<n. In one embodiment, the memory module 300 generates valid data in each cycle in which a write command is generated after the first cycle of the write command sequence. In another embodiment, the memory module 300 generates valid data in each cycle in which a write command is generated after generating a first cycle containing a write command. Further, the cycle containing the first occurrence of a write command in the n cycle write command sequence is generated with arbitrary data.

In another embodiment, a memory module 300 of FIG. 3 receives a write request and generates a write command sequence of n cycles in response to the write request. The memory module 300 provides valid data in each cycle in which a write command is generated after a $m^{th}$ cycle to a first plurality of data input buffers. The first plurality of data input buffers belong to a memory device for which the write command sequence is being generated. Further, arbitrary data is generated on the first cycle through the $m^{th}$ cycle. Additionally, memory module 300 generates valid data to the memory device for a second plurality of data input buffers on a first cycle of the write command sequence. Alternately, valid data is generated for a second plurality of data input buffers on a first cycle of the write command sequence containing a write command. In another embodiment, valid data is provided for a second plurality of data input buffers on a $k^{th}$ cycle of the write command sequence, k<m, where the $k^{th}$ cycle contains a write command. Further, valid data is generated for a third plurality of data input buffers on the $j^{th}$ cycle of the write command sequence, m<j<n, the $j^{th}$ cycle containing a write command.

For the above embodiments, the software command sequence is realized as a data signal for a memory device embodied in a set of electrical signals. The data signal includes a sequence of n cycles. Each cycle contains a plurality of data portions. A first data portion contains data representing a command. A second data portion contains data representing a memory address. A third data portion contains data representing data to be stored in the memory, or a code for a memory to perform an operation. The code for a memory to perform an operation also includes codes for subsequent processing of the software command sequence.

A software command sequence, formatted as a write command sequence, generates arbitrary data for the third data portion in a cycle containing a write command in the first data portion, for the first occurrence of the write command in the n cycle sequence. Subsequently, valid data is provided in the third data portion for cycles containing a write command in the first data portion. In another embodiment, a write command sequence generates arbitrary data for the third data portion in the first one or two cycles that contain a write command in the first data portion. Subsequently, valid data is provided in the third data portion for cycles containing a write command in the first data portion. In another embodiment, the write command sequence can be generated with valid data in the third data portion beginning on any cycle of the n cycle sequence.

As can be appreciated by those skilled in the art, the data portions above can be arranged in any order. Further, additional data portions can be designed for each cycle. For instance, the 8 cycle sequences in Table 1 show 5 data portions where a data portion containing data representing an address is divided into two data portions, one data portion containing data representing a bank, and another data portion containing data representing an address within the bank. Additionally, each cycle of the 8 cycle software command sequence of Table 1 includes a fifth data portion containing data representing a control signal, RP#, having a high (H), a low (L), or a high value set at a particular level (VHH).

Operating a Memory Device

Figure 6A:
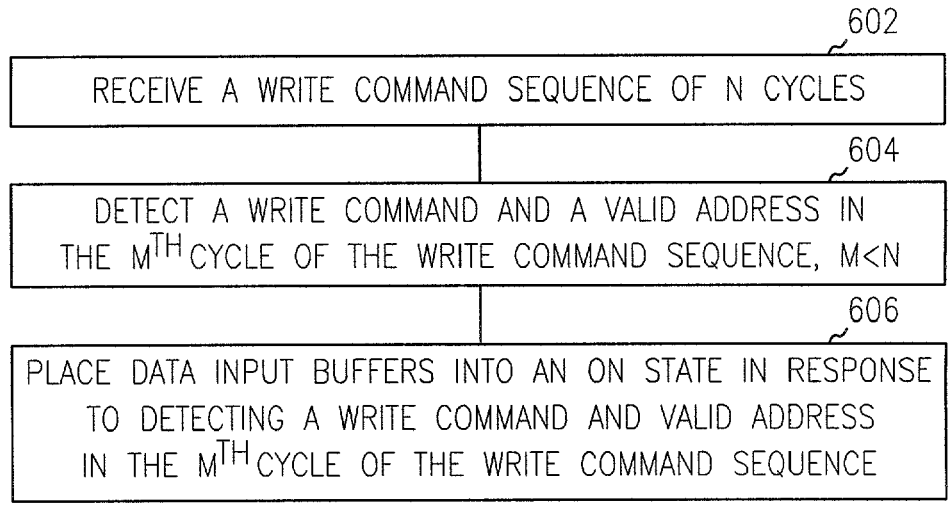
FIG. 6A shows a method of operating a memory device in conjunction with a software command sequence for optimizing power consumption by the memory device in an embodiment according to the teachings of the present invention.

FIG. 6A shows a method of operating a memory device 200 of FIG. 2 in conjunction with a software command sequence for optimizing power consumption by the memory device 200 in an embodiment according to the teachings of the present invention. Operating the memory device 200 in conjunction with such a software command sequence includes receiving a write command sequence of n cycles in block 602, detecting a write command and a valid address in the $m^{th}$ cycle of the write command sequence, m<n, in block 604, and placing data input buffers 204 into an on state in response to detecting the write command and the valid address in the $m^{th}$ cycle in block 606. In one embodiment, operating the memory device 200 includes detecting a write command in the second cycle of a write command sequence. Alternately, operating the memory device 200 includes detecting the write command with a valid address on the first cycle of the write command sequence. In one embodiment for a write command detected in a first cycle, a valid address is any address other than a predetermined set of addresses that correspond to a read command sequence. In another embodiment, operating the memory device includes detecting the first cycle containing a write command with a valid address.

Figure 6B:
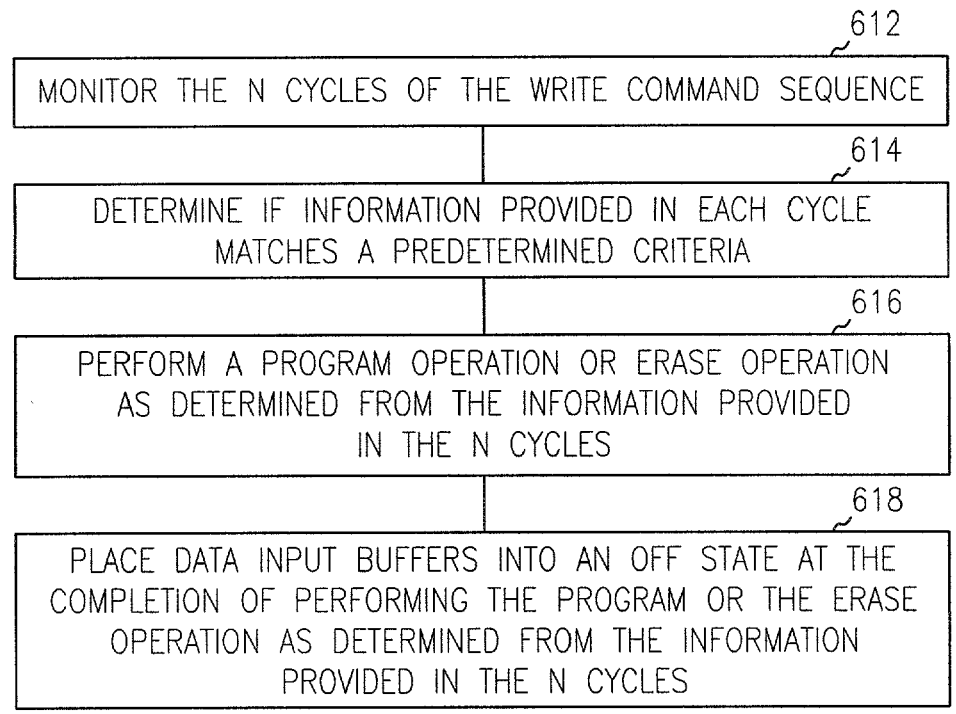
FIG. 6B shows a method for further operating the memory device based on the information contained in a received write command sequence of FIG. 6A in an embodiment according to the teachings of the present invention.

FIG. 6B shows a method for further operating the memory device 200 of FIG. 2 based on the information contained in the received write command sequence of FIG. 6A in an embodiment according to the teachings of the present invention. The method further includes monitoring the n cycles of the received write command sequence in block 612, determining if information provided in each cycle matches a predetermined criteria in block 614, performing a program operation or an erase operation as determined from the information provided in the n cycles in block 616, and placing the data input buffers into an off state upon completing the program operation or the erase operation in block 618. For data input buffers selected to be in a continually on state, these buffers remain on at the completion of the program or write operation. Operating the memory device 200 includes taking safety precautions such as prohibiting a write or erase operation if an address monitored while receiving the write command sequence differs from a predetermined address for each cycle.

Having determined that a write command sequence is being received, the memory device 200 monitors each cycle for a predetermined address that is associated with a code indicating a particular type of program or erase operation. For instance, in Table 1, the memory device 200 monitoring the address in the third, fourth and fifth cycles detects addresses that are the same for both a erase setup/confirm operation and a program setup/confirm operation. The addresses for these two operations differ in the sixth cycle. Further in the seventh and eighth cycles, the memory device 200 uses the detected addresses as the row and column (along with a bank address) to identify the memory located to which the determined operation is to be performed. Having monitored the first sixth cycles and detected proper codes and addresses, the memory device 200 takes the addresses of the seventh and eighth cycles as valid or predetermined addresses of memory locations to which a decoded operation will be applied.

It can be appreciated by those skilled in the art that operating memory device 200 includes performing other standard operations for a memory device and includes operating the memory device 200 in the various embodiments of memory device 200 as discussed herein.

CONCLUSION

A software command sequence is provided to a memory device, where the software command sequence is constructed by generating a write command sequence of n cycles and providing valid data in each cycle in which a write command is generated after a $m^{th}$ cycle of the write command sequence, where m is less than n. Such a software command sequence allows for optimizing the power consumption by the memory device. The memory device maintains its data input buffers in an off state until it receives a write command sequence, at which time, the memory device turns on its data input buffers. Upon completion of a program or erase operation defined in the received write command sequence, the memory device then returns its data input buffers to an off state. For a memory device, such as a non-volatile memory, programming and erasing activities comprise a relatively small amount of the activity of these memories. Consequently, current usage is significantly reduced having data input buffers normally configured in an off state.

The structure of the write command sequence also allows a subset of the data input buffers to be continually in an on state. With a subset of data input buffers continually on, the memory device, if needed, can employ precautionary procedures using these continually on data input buffers to insure that a valid write command sequence is actually being received. At the same time, with the remaining data input buffers normally in an off state, power consumption can still be reduced.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method to control writing to a memory device comprising:
controlling a device to generate a command sequence of n cycles to control writing data to the memory device, each cycle including data, an address, and a specific command, the specific command generated by applying a set combination of control signals;
providing valid data in each cycle in which a write command is generated after a $m^{th}$ cycle of the command sequence, m being less than n;
providing arbitrary data in a cycle in which a write command is generated and arranged in one of a first cycle through the $m^{th}$ cycle, the arbitrary data being data not for operational use by the memory; and
transmitting the command sequence from the device to turn on a data input buffer in the memory device and to write to the memory device.

2. The method of claim 1, wherein providing valid data in each cycle in which a write command is generated after a $m^{th}$ cycle of the command sequence is performed with the $m^{th}$ cycle being a first cycle containing a write command.

3. The method of claim 1, wherein generating a command sequence of n cycles includes generating a command code to program or erase specified portions of the memory device.

4. A method to control writing to a memory device comprising:
controlling a device to generate a command sequence of n cycles to control writing data to the memory device;
providing valid data in each cycle in which a write command is generated after a $m^{th}$ cycle of the command sequence, m being less than n, wherein providing valid data in each cycle in which a write command is generated after a $m^{th}$ cycle of the command sequence occurs for m equal to one; and
transmitting the command sequence from the device to turn on a data input buffer in the memory device and to write to the memory device.

5. A method to control writing to a memory device comprising:
controlling a device to generate a command sequence of n cycles to control writing data to the memory device;
providing valid data in each cycle in which a write command is generated after a $m^{th}$ cycle of the command sequence, m being less than n, wherein providing valid data in each cycle in which a write command is generated after a $m^{th}$ cycle of the command sequence is performed with the $m^{th}$ cycle being a second cycle containing a write command; and
transmitting the command sequence from the device to turn on a data input buffer in the memory device and to write to the memory device.

6. A method to control writing to a memory device comprising:
controlling a device to generate a command sequence of n cycles to control writing data to the memory device;
providing valid data in each cycle in which a write command is generated after a $m^{th}$ cycle of the command sequence, m being less than n, wherein the method further includes providing arbitrary data in a cycle in which a write command is generated and arranged in one of a first cycle through the $m^{th}$ cycle, the arbitrary data being data not for operational use by the memory; and
transmitting the command sequence from the device to turn on a data input buffer in the memory device and to write to the memory device.

7. A method to control writing to a memory device comprising:

controlling a device to generate a command sequence of n to control writing data to the memory device;

generating valid data provided for a first plurality of data input buffers in each cycle in which a write command is generated after a $m^{th}$ cycle of the command sequence, m being less than n;

providing arbitrary data in a cycle in which a write command is generated and arranged in one of a first cycle through the $m^{th}$ cycle, the arbitrary data being data not for operational use by the memory; and transmitting the command sequence from the device to write to the memory device.

8. A method to control writing to a memory device comprising:

controlling a device to generate a command sequence of n cycles to control writing data to the memory device;

generating valid data provided for a first plurality of data input buffers in each cycle in which a write command is generated after a $m^{th}$ cycle of the command sequence, m being less than n, wherein the method further includes generating valid data provided for a second plurality of data input buffers on a first cycle containing a write command of the command sequence; and transmitting the command sequence from the device to write to the memory device.

9. A method to control writing to a memory device comprising:

controlling a device to generate a command sequence of n cycles to control writing data to the memory device;

generating valid data provided for a first plurality of data input buffers in each cycle in which a write command is generated after a $m^{th}$ cycle of the command sequence, m being less than n, wherein the method further includes generating valid data provided for a second plurality of data input buffers on a $k^{th}$ cycle of the command sequence, k being less than m, the $k^{th}$ cycle containing a write command; and transmitting the command sequence from the device to write to the memory device.

10. A method to control writing to a memory device comprising:

controlling a device to generate a command sequence of n cycles to send data to the memory device;

generating valid data provided for T data input buffers, the T data input buffers grouped into R sets of data input buffers, wherein valid data is provided for a $j^{th}$ set of the R sets of data input buffers on a $m_j^{th}$ cycle of the command sequence, $1 \leq j \leq R$ and $1 \leq m_j \leq n$, the $m_j^{th}$ cycle containing a write command; and transmitting the command sequence from the device to write to the memory device.

11. The method of claim 10, wherein generating valid data provided for T data input buffers includes generating valid data provided for T data input buffers, T equal to 32.

12. A method to control writing to a memory device comprising:

receiving a write request in a device;

controlling the device to generate a command sequence of n cycles in response to the write request including determining a value for n, the command sequence to control writing data to the memory device; and providing valid data in each cycle in which a write command is generated after a $m^{th}$ cycle of the command sequence, m being less than n;

providing arbitrary data on a first cycle through the $m^{th}$ cycle; and transmitting the command sequence from the device to write to the memory device.

13. The method of claim 12, wherein providing valid data in each cycle in which a write command is generated after a $m^{th}$ cycle of the command sequence is performed for the $m^{th}$ cycle being a first cycle containing a write command.

14. A method to control writing to a memory device comprising:

receiving a write request in a device to control writing data to the memory device; and controlling the device to generate a command sequence of n cycles in response to the write request;

providing valid data in each cycle in which a write command is generated after a $m^{th}$ cycle of the command sequence, m being less than n, wherein providing valid data in each cycle in which a write command is generated after a $m^{th}$ cycle of the command sequence occurs for m equal to one; and transmitting the command sequence from the device to turn on a data input buffer in the memory device and to write to the memory device.

15. A method to control writing to a memory device comprising:

receiving a write request in a device to control writing data to the memory device; and controlling the device to generate a command sequence of n cycles in response to the write request, after receiving the write request; and providing valid data in each cycle in which a write command is generated after a $m^{th}$ cycle of the command sequence, m being less than n, wherein the method further includes providing arbitrary data on a first cycle through the $m^{th}$ cycle; the arbitrary data being data not for operating use by the memory; and transmitting the command sequence from the device to turn on a data input buffer in the memory device and to write to the memory device.

16. A method to control writing to a memory device comprising:

receiving a write request in a device to send data to the memory device;

controlling the device to generate a command sequence of n cycles in response to the write request including determining a value for n, to control writing the data to the memory device;

providing valid data in each cycle in which a write command is generated after a $m^{th}$ cycle of the command sequence, m being less than n, wherein the valid data is provided for a first plurality of data input buffers;

providing arbitrary data on a first cycle through the $m^{th}$ cycle; and transmitting the command sequence from the device to write to the memory device.

17. A method to control writing to a memory device comprising:

receiving a write request in a device to send data to the memory device;

controlling a device to generate a command sequence of n cycles in response to the write request, after receiving the write request, to control writing data to the memory device;

providing valid data in each cycle in which a write command is generated after a $m^{th}$ cycle of the command sequence, m being less than n, wherein the valid data is provided for a first plurality of data input buffers, wherein the method further includes providing arbitrary data on a first cycle through the $m^{th}$ cycle; and
transmitting the command sequence from the device to write to the memory device.

18. A method to control writing to a memory device comprising:
receiving a write request in a device to send data to the memory device;
controlling the device to generate a command sequence of n cycles in response to the write request to control writing the data to the memory device;
providing valid data in each cycle in which a write command is generated after a $m^{th}$ cycle of the command sequence, m being less than n, wherein the valid data is provided for a first plurality of data input buffers, wherein the method further includes providing valid data for a second plurality of data input buffers on a first cycle of the command sequence; and
transmitting the command sequence from the device to write to the memory device.

19. A method to control writing to a memory device comprising:
receiving a write request in a device to send data to the memory device;
controlling the device to generate a command sequence of n cycles in response to the write request to control writing the data to the memory device;
providing valid data in each cycle in which a write command is generated after a $m^{th}$ cycle of the command sequence, m being less than n, wherein the valid data is provided for a first plurality of data input buffers, wherein the method further includes providing valid data for a second plurality of data input buffers on a first cycle of the command sequence containing a write commend; and
transmitting the command sequence from the device to write to the memory device.

20. A method to control writing to a memory device comprising:
receiving a write request in a device to send data to the memory device;
controlling the device to generate a command sequence of n cycles in response to the write request to control writing the data to the memory device;
providing valid data in each cycle in which a write command is generated after a $m^{th}$ cycle of the command sequence, m being less than n, wherein the valid data is provided for a first plurality of data input buffers, wherein the method further includes generating valid data provided for a second plurality of data input buffers on a $k^{th}$ cycle of the command sequence, k being less than m, the $k^{th}$ cycle containing a write command; and
transmitting the command sequence from the device to write to the memory device.

21. The method of claim 20, wherein the method further includes generating valid data provided for a third plurality of data input buffers on the $j^{th}$ cycle of the command sequence, m<j<n, the $j^{th}$ cycle containing a write command.

22. A method of operating a memory device comprising:
receiving a command sequence of n cycles;
detecting a write command and a valid address in the $m^{th}$ cycle of the command sequence, m<n; and
placing data input buffers of the memory device into an on state in response to detecting a write command and a valid address in the $m^{th}$ cycle of the command sequence.

23. The method of claim 22, wherein detecting a write command and a valid address in the $m^{th}$ cycle of the command sequence occurs with m equal to one.

24. The method of claim 22, wherein detecting a write command and a valid address in the $m^{th}$ cycle of the command sequence is performed for the $m^{th}$ cycle being a first cycle containing a write command.

25. The method of claim 22, wherein receiving a command sequence of n cycles includes receiving a command sequence having a command code to program or erase specified portions of the memory device.

26. The method of claim 22, wherein the method further includes:
monitoring the n cycles;
determining if information provided in each cycle matches a predetermined criteria;
performing a program operation or an erase operation as determined from the information provided in the n cycles; and
placing the data input buffers into an off state at the completion of performing a program operation or an erase operation as determined from the information provided in the n cycles.

27. The method of claim 26, wherein the method further includes, for a data input buffer selected to be in a continually on state, maintaining the data buffer in an on state at the completion of performing a program operation or an erase operation as determined from the information provided in the n cycles.

28. The method of claim 26, wherein the method further includes monitoring a address provided in each cycle and prohibiting a write or erase operation if the monitored address differs from a predetermined address for each cycle.

29. The method of claim 28, wherein the method further includes taking the predetermined address in a cycle containing data to be programmed or a code commencing an erase operation to be the address to be programmed or erased.

30. The method of claim 24, wherein placing T data input buffers in an on state includes having at least one $j^{th}$ set of data input buffers continually in an on state.

31. The method of claim 24, wherein detecting a first cycle of a command sequence comprises detecting a first cycle containing a write command in the command sequence.

32. A method of operating a memory device comprising:
receiving a command sequence of n cycles;
detecting a write command and a valid address in the $m^{th}$ cycle of the command sequence, m<n; and
placing a first plurality of data input buffers of the memory device into an on state in response to detecting a write command and a valid address in the $m^{th}$ cycle of the command sequence.

33. The method of claim 32, wherein detecting a write command and a valid address in the $m^{th}$ cycle of the command sequence includes using an arbitrary address as a valid address associated with a first write command of the command sequence.

34. The method of claim 32, wherein the method further includes maintaining a second plurality of data input buffers in the on state continually.

35. The method of claim 32, wherein the method further includes placing a second plurality of data input buffers into an on state on a $k^{th}$ cycle of the command sequence in response to detecting a first cycle of a command sequence, k being less than m.

36. The method of claim 32, wherein the method further includes placing a second plurality of data input buffers into an on state on a $k^{th}$ cycle of the command sequence in response to detecting a first cycle containing a write command, k being less than m.

37. A method of operating a memory device comprising:
receiving a command sequence of n cycles;
detecting a first cycle of a command sequence; and
placing T data input buffers of the memory device in an on state, the T data input buffers grouped into R sets of data input buffers, a $j^{th}$ set of the R sets of data input buffers is placed in an on state beginning for a $m_j^{th}$ cycle of the command sequence for all $j^{th}$ sets, $1 \leq j \leq R$ and $1 \leq m_j \leq n$.

38. A memory device comprising:
control circuitry; and
data input buffers configured in an off state, the data input buffers switchable to an on state responsive to the control circuitry detecting an externally generated command sequence of n cycles, wherein the control circuitry is configured to place the data input buffers into an off state upon completing an execution of an operation defined by the command sequence.

39. The memory device of claim 38, wherein the control circuitry is configured to identify the first m cycles of the command sequence, m<n.

40. The memory device of claim 39, wherein the control circuitry is further configured to detect commands and addresses associated with the command in each cycle of the command sequence.

41. The memory device of claim 38, wherein the control circuitry is configured to place the data input buffers in an on state in response to detecting a first m cycles of the command sequence of n cycles.

42. The memory device of claim 41, wherein the control circuitry is further configured to detect a first m cycles of a command sequence of n cycles by determining the presence of at least one write command with a predetermined address in the first m cycles of the command sequence.

43. The memory device of claim 41, wherein m equals one.

44. The memory device of claim 41, wherein the $m^{th}$ cycle is a first cycle containing a write command in the command sequence.

45. The memory device of claim 38, wherein the memory device is a non-volatile memory.

46. The memory device of claim 38, wherein the memory device is a synchronous Flash memory.

47. The memory device of claim 38, wherein n is in range $3 \leq n \leq 8$.

48. A memory device comprising:
control circuitry; and
a first plurality of data input buffers configured in an off state, wherein the first plurality of data input buffers are placed in an on state in response to the control circuitry detecting a first m cycles of an externally generated command sequence of n cycles, m<n, wherein the control circuitry is configured to place the data input buffers into an off state upon completing an execution of an operation defined by the command sequence.

49. The memory device of claim 48, further including a second plurality of data input buffers continuously configured in an on state.

50. The memory device of claim 48, further including a second plurality of data input buffers configured in an off state, wherein the second plurality of data input buffers are placed in an on state on a $k^{th}$ cycle of the command sequence in response to the control circuitry detecting a first cycle of the externally generated command sequence of n cycles, k<n.

51. The memory device of claim 48, further including a second plurality of data input buffers configured in an off state, wherein the second plurality of data input buffers are placed in an on state on a $k^{th}$ cycle of the command sequence in response to the control circuitry detecting a first cycle of the externally generated command sequence containing a write command.

52. A memory device comprising:
control circuitry; and
T data input buffers configured in an off state, the T data input buffers grouped into R sets of data input buffers, wherein a $j^{th}$ set of the R sets of data input buffers is placed in an on state beginning for a $m_j^{th}$ cycle of an externally generated command sequence of n cycles in response to the control circuitry detecting a reception of a command sequence for all $j^{th}$ sets, $1 \leq j \leq R$ and $1 \leq m_j \leq n$.

53. The memory device of claim 52, wherein the control circuitry detects a reception of a command sequence by detecting a first write command.

54. The memory device of claim 52, wherein at least one $j^{th}$ set of data input buffers is continually in an on state.

55. The memory device of claim 52, wherein the control circuitry places the T data input buffers in an off state upon completion of a program or erase operation.

56. The memory device of claim 55, wherein a $j^{th}$ set designated as a data input buffer in a continually on state remains in an on state upon completion of the program or erase operation.

57. A memory module comprising:
input ports for receiving a write request;
a load command unit coupled to the input ports for converting the received write request into a command sequence of n cycles having valid data in each cycle in which a write command is generated after a $m^{th}$ cycle of the command sequence, m being less than n, wherein the load command unit is configured to determine a value of n and to generate arbitrary data in each cycle where a write command is generated before generating the $m^{th}$ cycle in the n cycle command sequence; and
output ports coupled to the load command unit for directing the command sequence to a memory device.

58. The memory module of claim 57, wherein the load command unit is configured to generate a write command with associated valid data during a $m^{th}$ cycle in the n cycle command sequence after generating a cycle with a first write command, wherein m is less than n.

59. The memory module of claim 58, wherein the load command unit is configured to generate valid data for each cycle containing a write command after the $m^{th}$ cycle.

60. The memory module of claim 57, wherein the load command unit is configured to generate a write command with associated valid data during a $m^{th}$ cycle in the n cycle command sequence, the $m^{th}$ cycle is the first cycle in the n cycle command sequence containing a write command, wherein 1<m<n.

61. A memory module comprising:
input ports for receiving a write request;
a load command unit coupled to the input ports for converting the received write request into a command sequence of n cycles having valid data in each cycle in which a write command is generated after a $m^{th}$ cycle of the command sequence, m being less than n; and output ports coupled to the load command unit for directing the command sequence to a memory device to turn on a data input buffer in the memory device and to write to the memory device, wherein the load command unit is configured to generate a write command with associated valid data during a $m^{th}$ cycle in the n cycle command sequence after generating a cycle with a first write command, wherein m is less than n, wherein the load command unit is configured to generate arbitrary data in each cycle where a write command is generated before generating the $m^{th}$ cycle in the n cycle command sequence.

62. An information handling system comprising:
a processor;
a load command unit coupled to the processor for receiving a write request form the processor; and
a memory device coupled to the load command unit, wherein the load command unit is configured to generate a command sequence of n cycles to the memory device with valid data provided in each cycle containing a write command after a m cycle, $m^{th}$ being less than n, and the load command unit is configured to generate arbitrary data in each cycle where a write command is generated before generating the $m^{th}$ cycle in the n cycle command sequence, the command sequence to turn on a data input buffer in the memory device and to write to the memory device.

63. The information handling system of claim 62, wherein the load command unit is further configured to generate the command sequence of n cycles to the memory device in response to the write request from the processor.

64. An information handling system comprising:
a processor;
a load command unit coupled to the processor for receiving a write request form the processor; and
a memory device coupled to the load command unit, wherein the load command unit is configured to generate a command sequence of n cycles to the memory device with valid data provided in each cycle containing a write command after a $m^{th}$ cycle, m being less than n, wherein the memory device comprises data input buffers configured in an off state until the memory device determines the reception of a command sequence.

65. The information handling system of claim 64, wherein the memory device is configured to place the data input buffers in an on state upon detecting a first cycle of the n cycle command sequence containing a write command.

66. The information handling system of claim 64, wherein the memory device is configured to place the data input buffers in an off state upon completing an operation defined in the command sequence.

67. An information handling system comprising:
a processor; and
a memory device coupled to the processor, the memory device comprising:
control circuitry; and
data input buffers configured in an off state, the data input buffers switchable to an on state responsive to the control circuitry detecting an externally generated command sequence of n cycles, wherein the control circuitry is configured to place the data input buffers into an off state upon completing an execution of an operation defined by the command sequence.

68. The information handling system of claim 67, wherein the control circuitry is configured to identify the first m cycles of the command sequence, m<n.

69. The information handling system of claim 68, wherein the control circuitry is further configured to detect addresses associated with a command in each cycle of the command sequence.

70. The information handling system of claim 67, wherein the control circuitry is configured to place the data input buffers in an on state in response to detecting a first m cycles of the command sequence of n cycles.

71. The information handling system of claim 70, wherein m equals one.

72. The information handling system of claim 70, wherein the $m^{th}$ cycle is a first cycle containing a write command in the command sequence.

73. The information handling system of claim 67, wherein n is in range $3 \leq n \leq 8$.

74. An information handling system comprising:
a processor; and
a memory device coupled to the processor, the memory device comprising: control circuitry; and
data input buffers configured in an off state, the data input buffers switchable to an on state responsive to the control circuitry detecting an externally generated command sequence of n cycles, wherein the control circuitry is configured to place the data input buffers in an on state in response to detecting a first m cycles of the command sequence of n cycles, wherein the control circuitry is further configured to detect a first m cycles of a command sequence of n cycles by determining the presence of at least one write command with a predetermined address in the first m cycles.

75. An apparatus comprising:
a control unit to write to a memory, the control unit configured to arrange a command sequence to control writing of data to the memory, the command sequence having n cycles such that the sequence of n cycles contains valid data for each cycle containing a write command beginning in a $m^{th}$ cycle, m<n, wherein the command sequence contains arbitrary data for each cycle containing a write command prior to the $m^{th}$ cycle and the command sequence includes at least one cycle having a write command prior to the $m^{th}$ cycle, the arrangement of the command sequence to turn on a data input buffer in the memory and to write to the memory.

76. The apparatus of claim 75, wherein n equals eight.

77. The apparatus of claim 75, wherein m equals four.

78. The apparatus of claim 75, wherein m equals six.

79. The apparatus of claim 75, wherein each cycle contains a fourth data portion containing data representing a bank address.

80. The apparatus of claim 79, wherein valid data representing a bank address is provided in the second cycle and subsequent cycles of the n cycle sequence, the valid data remaining constant in the second and subsequent cycles.

UNITED STATES PATENT AND TRADEMARK OFFICE
CERTIFICATE OF CORRECTION

| | | |
|---|---|---|
| PATENT NO. | : 7,251,711 B2 | Page 1 of 1 |
| APPLICATION NO. | : 10/156420 | |
| DATED | : July 31, 2007 | |
| INVENTOR(S) | : Roohparvar | |

It is certified that error appears in the above-identified patent and that said Letters Patent is hereby corrected as shown below:

Title Page 2, in field (56), under "U.S. Patent Documents", in column 2, line 2, after "B1" insert -- * --.

Title Page 2, in field (56), under "U.S. Patent Documents", in column 2, line 2, after "Noh" insert -- 711/169 --.

In column 5, line 60, delete "optomized" and insert -- optimized --, therefor.

In column 18, line 33 (Approx.), in Claim 15, delete "cycle;" and insert -- cycle, --, therefor.

In column 18, line 34 (Approx.), in Claim 15, delete "operating" and insert -- operational --, therefor.

In column 19, line 35, in Claim 19, delete "commend;" and insert -- command; --, therefor.

In column 21, line 11, in Claim 37, after "buffer," insert -- wherein --.

In column 23, line 21, in Claim 62, delete "m" and insert -- $m^{th}$ --, therefor.

In column 23, line 21, in Claim 62, delete "$m^{th}$" and insert -- m --, therefor.

Signed and Sealed this

Twenty-third Day of October, 2007

JON W. DUDAS
*Director of the United States Patent and Trademark Office*